United States Patent [19]

Proebsting

[11] Patent Number: 5,479,646
[45] Date of Patent: Dec. 26, 1995

[54] METHOD AND APPARATUS FOR OBTAINING DATA FROM A DATA CIRCUIT UTILIZING ALTERNATING CLOCK PULSES TO GATE THE DATA TO THE OUTPUT

[75] Inventor: Robert J. Proebsting, Los Altos Hills, Calif.

[73] Assignee: Intergraph Corporation, Huntsville, Ala.

[21] Appl. No.: 118,539

[22] Filed: Sep. 8, 1993

Related U.S. Application Data

[63] Continuation-in-part of Ser. No. 19,560, Feb. 19, 1993.

[51] Int. Cl.[6] .................................................. G06F 1/04
[52] U.S. Cl. ................ 395/494; 364/271.5; 364/251.4; 364/945.9; 364/950.4; 364/950; 364/960.4
[58] Field of Search ........................... 395/550; 307/234, 307/601; 371/61; 375/106

[56] References Cited

U.S. PATENT DOCUMENTS

| | | | |
|---|---|---|---|
| 3,634,869 | 1/1972 | Hsueh | 307/234 |
| 3,699,524 | 10/1972 | Norberg | 340/172.5 |
| 4,056,851 | 11/1977 | Hovagimyan et al. . | |
| 4,079,456 | 3/1978 | Lunsford et al. | 364/200 |
| 4,163,944 | 8/1979 | Chambers et al. | 325/446 |
| 4,631,659 | 12/1986 | Hayn, II et al. . | |
| 4,785,415 | 11/1988 | Karlquist . | |
| 4,985,643 | 1/1991 | Proebsting . | |
| 5,243,456 | 9/1993 | Hirakata | 359/180 |
| 5,255,383 | 10/1993 | Lewis et al. . | |
| 5,261,081 | 11/1993 | Waite et al. | 395/550 |
| 5,333,154 | 7/1994 | Hengeveld et al. | 375/106 |
| 5,333,154 | 7/1994 | Hengeveld et al. . | |

*Primary Examiner*—Kevin A. Kriess
*Attorney, Agent, or Firm*—Townsend and Townsend and Crew

[57] ABSTRACT

A master clock generates master clock pulses having a selected frequency. A data clock generates a first data clock pulse corresponding to the leading edge of each master clock pulse and a second data clock pulse corresponding to the trailing edge of each master clock pulse. The first and second data clock pulses are applied to an input node of the data circuit. The data circuit generates a first data signal at an output node in response to the first data clock pulse and a second data signal at the output node in response to the second data clock pulse. There is a selected delay between the time a data clock pulse is applied to the input node and the time a data signal appears at the output node. First and second memory elements are provided for storing the data signals from the data circuit. A signal storing circuit stores the first data signal in one of the first or second memory element in response to the first data clock pulse and stores the second data signal in the other first or second memory element in response to the second data clock pulse. Gating circuitry is coupled to the first and second memory elements and to the master clock for selectively outputting the first and second data signals in accordance with the state of the master clock signal.

39 Claims, 2 Drawing Sheets

METHOD AND APPARATUS FOR OBTAINING DATA FROM A DATA CIRCUIT UTILIZING ALTERNATING CLOCK PULSES TO GATE THE DATA TO THE OUTPUT

CROSS REFERENCE TO RELATED APPLICATION

This application is a continuation-in-part of application Ser. No. 08/019,560 filed Feb. 19, 1993.

BACKGROUND OF THE INVENTION

The present invention is directed to data processing systems and, more particularly, to a method and apparatus for obtaining data from a data circuit which has a selected delay between the time a clock signal initiates functioning of the circuit and the time the data apt,ears at an output node of the circuit.

A random access memory is an example of a data circuit which has a selected delay between the time a data clock signal initiates functioning of the circuit and the time the data appears at an output node of the circuit. The delay is usually caused by propagating the data clock signal through a plurality of levels of post-charge inverter logic within the memory circuit. An example of a circuit which employs post-charge logic is disclosed in U.S. Pat. No. 4,985,643, issued to the present inventor and incorporated herein by reference.

To maximize the amount of data that may be obtained from a memory circuit in a given time interval, many applications request new data from the memory circuit before data from a previous request becomes available (i.e., by pipelining data requests). FIG. 1 is a timing diagram illustrating the technique. Assume there is a 20 ns delay between the time a data clock pulse is applied to an input node of a memory circuit and the time the requested data appears at an output node of the circuit. Master clock pulses having a 20 ns period are used to control the memory accesses. A data clock pulse is applied to the input terminal of the circuit at each leading (data clock 1) and trailing (data clock 2) master clock pulse edge for requesting data from the circuit, and the requested data appears at the output node of the circuit 20 ns after each data clock pulse. The data is read at subsequent leading and trailing master clock pulse edges. For example, the data requested at the leading edge of the first master clock pulse (via the first data clock pulse) appears at the output node of the circuit 20 ns later and may be read at the leading edge of the second master clock pulse. Similarly, the data requested at the trailing edge of first master clock pulse (via the second data clock pulse) appears at the output node of the circuit 20 ns later arid may be read at the trailing edge of the second master clock pulse.

While this scheme works as long as the master clock pulses are generated exactly at the frequency determined by the delay of the memory circuit, problems arise when the same scheme is employed with a master clock having a lower frequency or when the propagation delay is less than anticipated due to the memory circuit fabrication tolerances. FIG. 2 is timing diagram of a circuit wherein the master clock pulses have a period of 60 ns. A first data clock pulse is applied to the circuit at the leading edge of the first master clock pulse, and the data appears at the output node of the circuit 20 ns later. A second data clock pulse is applied to the circuit at the trailing edge of the first master clock pulse, and the data appears at the output node of the circuit 20 ns later. At the leading edge of the second master clock pulse, the system attempts to read the data corresponding to the first data clock pulse. Unfortunately, the data corresponding to the second data clock pulse already appeared at the output node of the circuit and overwrote the data corresponding to the first data clock pulse.

SUMMARY OF THE INVENTION

The present invention is directed to a method and apparatus for obtaining data from a data circuit having a selected delay between the time a clock signal initiates functioning of the circuit and the time the data appears at an output node of the circuit. An apparatus constructed according to the present invention allows pipelining data accesses while preventing the overwriting of output data until the data is properly read.

In one embodiment of the present invention, a master clock generates master clock pulses having a selected frequency. A data clock generates a first data clock pulse corresponding to the leading edge of each master clock pulse and a second data clock pulse corresponding to the trailing edge of each master clock pulse. The first and second data clock pulses are applied to an input node of the data circuit. The data circuit generates a first data signal at an output node in response to the first data clock pulse and a second data signal at the output node in response to the second data clock pulse. There is a selected delay between the time a data clock pulse is applied to the input node and the time a data signal appears at the output node. First and second memory elements are provided for storing the data signals from the data circuit. A signal storing circuit stores the first data signal in one of the first or second memory element in response to the first data clock pulse and stores the second data signal in the other first or second memory element in response to the second data clock pulse.

The signal storing circuit includes a first delay element for producing a first delay clock signal in response to the first data clock pulse and a second delay element for producing a second delay clock signal in response to the second data clock pulse. The first and second delay elements each have a delay less than the selected delay. A bistable element generates a first bistable signal in response to the first delay clock signal and a second bistable signal in response to the second delay clock signal. A gating circuit stores the first data signal in the first memory element in response to the first bistable signal and stores the second data signal in the second memory element in response to the second bistable signal.

DESCRIPTION OF THE PREFERRED EMBODIMENT

Figure 3:
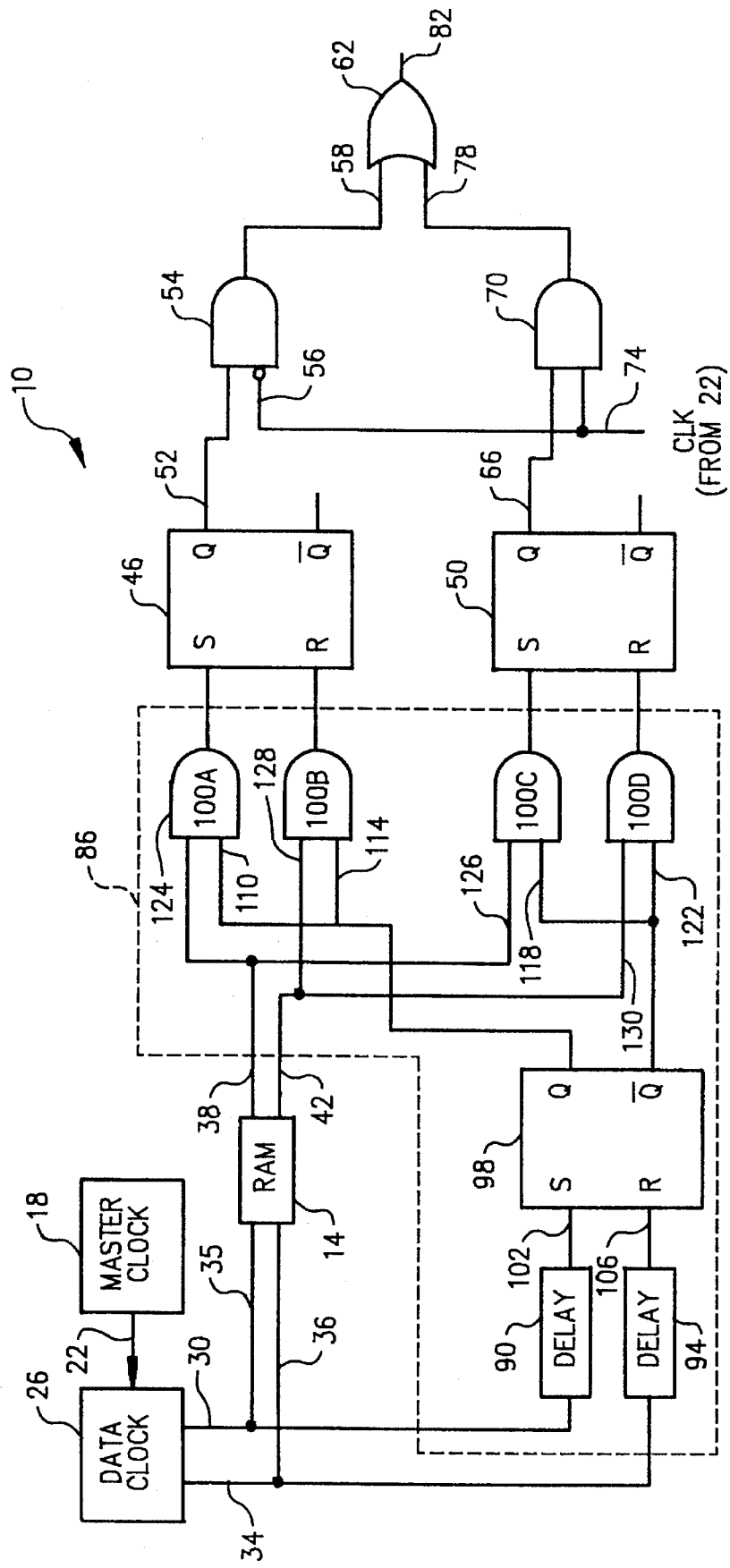
FIG. 3 is a block diagram of a particular embodiment of an apparatus according to the present invention for obtaining data from the data circuit.

FIG. 3 is a block diagram of a particular embodiment of an apparatus 10 according to the present invention for obtaining data from a data circuit such as a random access memory (RAM) 14. Apparatus 10 includes a master clock circuit 18 for generating master clock pulses CLK having a selected frequency on a line 22. Each master clock pulse has a leading edge and trailing edge. A data clock circuit 26 receives the master clock pulses over line 22 and generates a first data clock signal (e.g., a pulse) on a line 30 corresponding to the leading edge of each master clock pulse and a second data clock signal (e.g., a pulse) on a line 34 corresponding to the trailing edge of each master clock pulse. Lines 30 and 34 are coupled to input terminals 35 and 36, respectively, of RAM 14 for accessing data contained therein. RAM 14 generates first data signals on differential output terminals 38 and 42 in response to the first data clock pulses received on input terminal 35, and RAM 14 generates second data signals on differential output terminals 38 and 42 in response to the second data clock pulses received on input terminal 36. In this embodiment, an active (e.g., high) signal on line 38 indicates a "1" data bit from RAM 14, and an active (e.g. high) signal on line 42 represents a "0" data bit from RAM 14. There is a selected delay between the time a data clock pulse appears on input terminals 35 or 36 and the time the corresponding data signals appear on differential output terminals 38 or 42 as a result of propagating the data clock pulses through a plurality of levels of post charge inverter logic.

A first memory element 46 and a second memory element 50 are provided for storing data signals from RAM 14. Memory elements 46 and 50 may comprise flip-flops or some other data storing elements. As discussed below, in this embodiment memory element 46 stores data signals from RAM 14 generated by the first data clock pulses, and memory element 50 stores data signals from RAM 14 generated by the second data clock pulses. Memory element 46 has an output terminal 52 for communicating the stored data signals to an AND gate 54. AND gate 54 is selectively enabled by the CLK pulses from master clock 18 received on an inverted input terminal 56. Once enabled, AND gate 54 communicates the data signal from output terminal 52 to an input terminal 58 of an OR gate 62. Similarly, memory element 50 includes an output terminal 66 for communicating data signals to an AND gate 70. AND gate 70 is enabled by the CLK pulses from master clock 18 received on an input terminal 74. Once enabled, AND gate 70 communicates the data signals from output terminal 66 to an input terminal 78 of OR gate 62. The data signals are then communicated to other circuits through an output terminal 82 of OR gate 62.

A signal storing circuit 86 is provided for selectively storing signals from RAM 14 into memory elements 46 and 50. The signal storing circuit 86 includes delay elements 90 and 94, a bistable element such as a flip-flop 98, and two-input AND gates 100A–100D. Delay element 90 receives the first data clock pulses from line 30 and produces a first delayed clock signal or pulse on a line 102 to an S (set) input terminal of bistable element 98. Similarly, delay element 94 receives the second data clock pulses from line 34 and produces a second delayed clock signal on a line 106 to an R (reset) input terminal of bistable element 98. The delay of delay elements 90 and 94 is less than the selected delay of RAM 14, but more than half the selected delay of RAM 14. For example, if RAM 14 has a delay of 20 units of time, delay elements 90 and 94 each may have a delay of 15 units of time. Delay elements 90 and 94 may comprise a plurality of levels of post-charge inverter logic.

An active (e.g., high) delay clock signal on line 102 produces an active (e.g., high) signal at the Q output terminal of flip-flop 98 and an inactive (e.g., low) signal at the $\bar{Q}$ output terminal of flip-flop 98. Similarly, an active delay clock signal on line 106 produces an active signal at the $\bar{Q}$ output terminal of flip-flop 98 and an inactive signal at the Q output terminal of flip-flop 98. The Q output terminal of flip-flop 98 is coupled to one input terminal 110 of AND gate 100A and to one input terminal 114 of AND gate 100B. The $\bar{Q}$ output terminal of flip-flop 98 is coupled to one input terminal 118 of AND gate 100C and to one input terminal 122 of AND gate 100D. The other input terminals 124 and 126 of AND gates 100A and 100C, respectively, are coupled to line 38 of RAM 14, and the other input terminals 128 and 130 of AND gates 100B and 100D, respectively, are coupled to line 42 of RAM 14.

Figure 1:
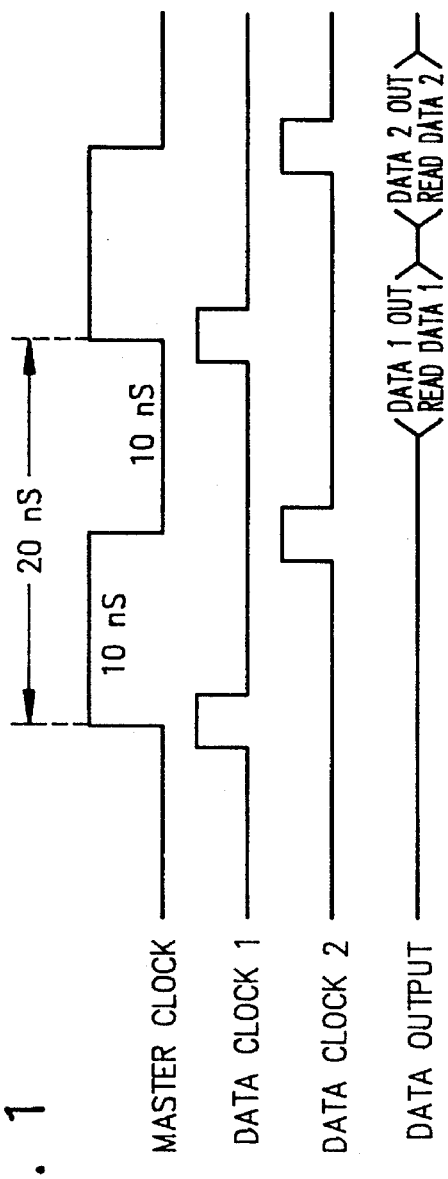
FIG. 1 is a timing diagram showing the operation of a data circuit which has a selected delay between the time a data clock pulse initiates functioning of the circuit and the time data appears at an output node of the circuit, wherein master clock pulses are used to generate the data clock pulses.

In operation, master clock circuit 18 produces the master clock pulses CLK and data clock circuit 26 produces the first and second data clock in pulses in the manner described above for FIGS. 1 and 2 (i.e, one data clock pulse per master clock pulse edge). As RAM 14 is being accessed by the first or second data clock pulses, the first or second data clock pulses are propagated through delay elements 90 or 94, respectively, and flip-flop 98 is set or reset accordingly. Thus, when RAM 14 is accessed by a first data clock pulse received on line 30, then an active bistable signal is generated at the Q output terminal of flip-flop 98 for enabling AND gates 100A and 100B before the data appears on differential output terminals 38 and 42. When the data signals appear on differential output terminals 38 and 42 shortly thereafter, flip-flop 46 will be set or reset depending upon which differential output terminal 38 or 42 contains the active (high) signal. Similarly, when RAM 14 is accessed by a data clock signal from line 34, then an active bistable signal is produced on the $\bar{Q}$ terminal of flip-flop 98, and flip-flop 50 is thereafter set or reset depending upon which differential output terminal 38 or 42 contains the active signal.

Figure 2:
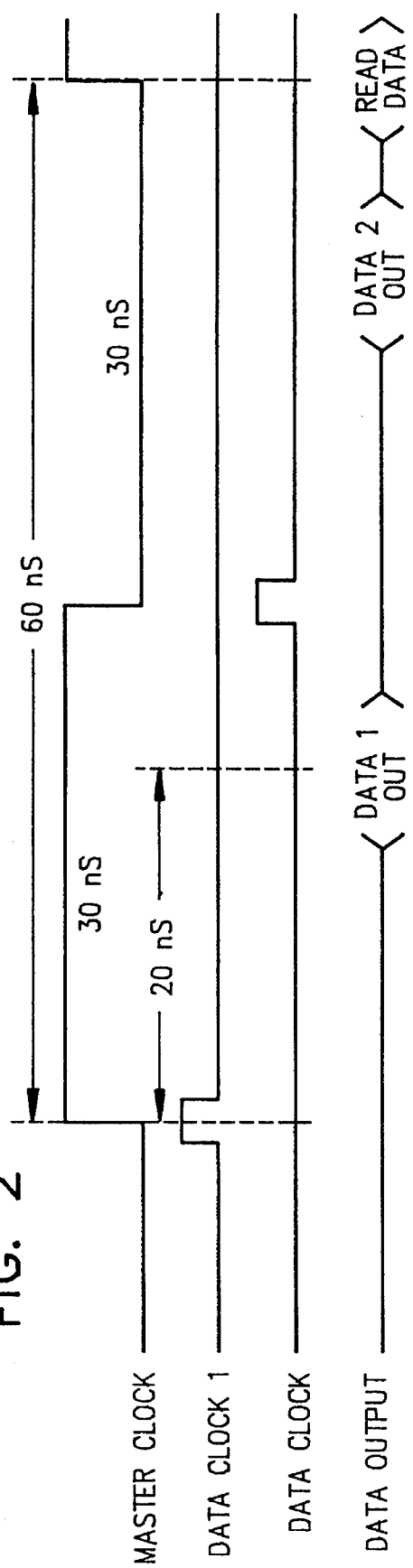
FIG. 2 is a timing diagram showing the erroneous operation of a prior art data circuit when a lower frequency master clock pulse is used to generate the data clock pulses.

When the circuit is operated as shown in FIG. 2, the first data item output from RAM 14 is saved in flip-flop 46, and the second data item output from RAM 14 is saved in flip-flop 50. There is no risk of the first data item being overwritten by the second data item. The first data item is valid on output terminal 82 of OR gate 62 during the low portion of the master clock pulse and may be read at the leading edge of the next master clock pulse, and the second data item is valid on output terminal 82 of OR gate 62 during the high portion of the master clock pulse and may be read at the trailing edge of the next master clock pulse.

While the above is a complete description of a preferred embodiment of the present invention, various modifications may be employed. For example, the circuit could be adapted to be used with active low signals. The circuit also could be adapted to be positive and/or negative edge triggered. Consequently, the scope of the invention should not be limited except as described in the claims.

What is claimed is:

1. An apparatus for obtaining data from a data circuit having a selected delay between the time a clock signal initiates functioning of the circuit and the time the data appears at an output node of the circuit, the apparatus comprising:

clock signal receiving means for receiving first and second clock signals from a clock signal source;

wherein the data circuit is coupled to the clock signal receiving means for receiving the first and second clock signals therefrom and for generating corresponding first and second data signals at the output node in response to the first and second clock signals;

a first memory element for storing data signals from the data circuit;

a second memory element for storing data signals from the data circuit; and signal storing means, coupled to the clock signal source, to the data circuit, to the first memory element, and to the second memory element, for storing the first data signal in one of the first memory element or second memory element in response to the first clock signal and for storing the second data signal in the other of the first memory element or second memory element in response to the second clock signal.

2. The apparatus according to claim 1 wherein the data circuit comprises a random access memory.

3. The apparatus according to claim 1 wherein the data circuit propagates the clock signal through a plurality of levels of logic to generate the selected delay.

4. The apparatus according to claim 1 wherein the signal storing means comprises:
- a first delay element coupled to the clock signal receiving means for producing a first delayed clock signal in response to the first clock signal, the first delay element having a delay less than the selected delay;
- a second delay element coupled to the clock signal receiving means for producing a second delayed clock signal in response to the second clock signal, the second delay element having a delay less than the selected delay;
- wherein the first data signal is stored in one of the first memory element or second memory element in response to the first delayed clock signal, and the second data signal is stored in the other first memory element or second memory element in response to the second delayed clock signal.

5. The apparatus according to claim 4 wherein the data circuit propagates the clock signal through a plurality of levels of post-charge inverter logic to generate the selected delay.

6. The apparatus according to claim 5 wherein the first delay element comprises a plurality of levels of post-charge inverter logic, and wherein the second delay element comprises a plurality of levels of post-charge inverter logic.

7. The apparatus according to claim 4 wherein the signal storing means further comprises:
- a bistable element coupled to the first delay element and to the second delay element for generating a first bistable signal in response to the first delayed clock signal and for producing a second bistable signal in response to the second delayed clock signal; and
- gate means, coupled to the bistable element, to the data circuit, to the first memory element, and to the second memory element, for storing the first data signal in the first memory element in response to the first bistable signal and for storing the second data signal in the second memory element in response to the second bistable signal.

8. The apparatus according to claim 7 wherein the bistable element comprises a flip-flop.

9. The apparatus according to claim 8 wherein the first memory element comprises a first flip-flop, and wherein the second memory element comprises a second flip-flop.

10. The apparatus according to claim 9 wherein the gate means comprises:
- a first AND gate having a first input terminal coupled to the output node, a second input terminal coupled to the bistable element for receiving the first bistable signal therefrom, and an output terminal coupled to the first flip-flop; and
- a second AND gate having a first input terminal coupled to the first output node, a second input terminal coupled to the bistable element for receiving the second bistable signal therefrom, and an output terminal coupled to the second flip-flop.

11. In a data processing system including a random access memory, a master clock, and a data clock, wherein the master clock generates master clock pulses having a selected frequency, each master clock pulse having a leading edge and a trailing edge, wherein the data clock generates a first data clock signal corresponding to the leading edge of each master clock pulse for accessing the memory and a second data clock signal corresponding to the trailing edge of each master clock pulse for accessing the memory, wherein the memory produces a first data signal on the output node in response to the first data clock signal and a second data signal on the output node in response to the second data clock signal, and wherein the memory has a selected delay between the time a data clock signal initiates access of the memory and the time the data appears at the output node, an apparatus for retrieving data from the memory comprising:
- a first memory element for storing data signals from the output node;
- a second memory element for storing data signals from the output node; and
- signal storing means having means for producing first and second delayed data clock signals that have a delay less than the selected delay of the memory, coupled to the memory, to the first memory element, and to the second memory element, for storing the first data signal in one of the first memory element or second memory element in response to the first delayed data clock signal and for storing the second data signal in the other first memory element or second memory element in response to the second delayed data clock signal.

12. The apparatus according to claim 11 wherein the signal storing means comprises:
- a first delay element coupled to the data clock for producing a first delayed data clock signal in response to the first data clock signal corresponding to the leading edge, the first delay element having a delay less than the selected delay;
- a second delay element coupled to the data clock for producing a second delayed data clock signal in response to the second data clock signal corresponding to the leading edge, the second delay element having a delay less than the selected delay;
- wherein the first data signals are stored in one of the first memory element or second memory element in response to the first delayed data clock signal, and the second data signals are stored in the other first memory element or second memory element in response to the second delayed data clock signal.

13. The apparatus according to claim 12 wherein the signal storing means further comprises:
- a bistable element coupled to the first delay element and to the second delay element for generating a first bistable signal in response to the first delayed data clock signal and for producing a second bistable signal in response to the second delayed data clock signal; and
- gate means, coupled to the bistable element, to the memory, to the first memory element, and to the second memory element, for storing the first data signals in the first memory element in response to the first bistable signal and for storing the second data signals in the second memory element in response to the second bistable signal.

14. The apparatus according to claim 13 wherein the bistable element comprises a bistable flip-flop having a first input terminal coupled to the first delay element and a second input terminal coupled to the second delay element.

15. The apparatus according to claim 14 wherein the first memory element comprises a first flip-flop, and wherein the second memory element comprises a second flip-flop.

16. The apparatus according to claim 15 wherein the gate means comprises:

a first AND gate having a first input terminal coupled to the output node, a second input terminal coupled to the bistable element for receiving the first bistable signal therefrom, and an output terminal coupled to the first flip-flop, and a second AND gate having a first input terminal coupled to the output node, a second input terminal coupled to the bistable element for receiving the second bistable signal therefrom, and an output terminal coupled to the second flip-flop.

17. The apparatus according to claim 16 wherein the memory propagates the clock signal through a plurality of levels of post-charge inverter logic to generate the selected delay.

18. The apparatus according to claim 17 wherein the first delay element comprises a plurality of levels of post-charge inverter logic, and wherein the second delay element comprises a plurality of levels of post-charge inverter logic.

19. An apparatus for obtaining data from a data circuit having a selected delay between the time a clock pulse initiates functioning of the circuit and the time the data appears at an output node of the circuit comprising:

master clock means for generating master clock pulses having a selected frequency, each clock pulse having a leading edge and a trailing edge;

data clock means for generating a first data clock pulse corresponding to the leading edge of each master clock pulse, and for generating a second data clock pulse corresponding to the trailing edge of each master clock pulse;

wherein the data circuit is coupled to the data clock means for receiving the data clock pulses therefrom, the data circuit generating a first data signal at the output node in response to the first data clock pulse, and the data circuit generating a second data signal at the output node in response to the second data clock pulse;

a first memory element for storing data signals from the data circuit;

a second memory element for storing data signals from the data circuit; and signal storing means, coupled to the data clock for receiving the first and second data clock pulses, to the data circuit, to the first memory element, and to the second memory element, for storing the first data signal in one of the first memory element or second memory element in response to the first data clock pulse and for storing the second data signal in the other first memory element or second memory element in response to the second data clock pulse.

20. The apparatus according to claim 19 wherein the signal storing means comprises:

a first delay element coupled to the data clock means for producing a first delayed data clock signal in response to the first data clock pulse, the first delay element having a delay less than the selected delay;

a second delay element coupled to the data clock means for producing a second delayed data clock signal in response to the second data clock pulse, the second delay element having a delay less than the selected delay;

wherein the first data signal is stored in one of the first memory element or second memory element in response to the first delayed data clock signal, and the second data signal is stored in the other first memory element or second memory element in response to the second delayed data clock signal.

21. The apparatus according to claim 20 wherein the signal storing means further comprises:

a bistable element coupled to the first delay element and to the second delay element for generating a first bistable signal in response to the first delayed data clock signal and for producing a second bistable signal in response to the second delayed data clock signal; and gate means, coupled to the bistable element, to the data circuit, to the first memory element, and to the second memory element, for storing the first data signal in the first memory element in response to the first bistable signal and for storing the second data signal in the second memory element in response to the second bistable signal.

22. The apparatus according to claim 21 wherein the bistable element comprises a fistable flip-flop having a first input terminal coupled to the first delay element and a second input terminal coupled to the second delay element.

23. The apparatus according to claim 22 wherein the first memory element comprises a first flip-flop, and wherein the second memory element comprises a second flip-flop.

24. The apparatus according to claim 23 wherein the gate means comprises:

a first AND gate having a first input terminal coupled to the output node, a second input terminal coupled to the bistable element for receiving the first bistable signal therefrom, and an output terminal coupled to an input terminal of the first flip-flop;

a second AND gate having a first input terminal coupled to the output node, a second input terminal coupled to the bistable element for receiving the second bistable signal therefrom, and an output terminal coupled to an input terminal of the second flip-flop.

25. The apparatus according to claim 24 wherein the data circuit comprises a random access memory.

26. The apparatus according to claim 25 wherein the data circuit propagates the clock signal through a plurality of levels of post-charge inverter logic to generate the selected delay.

27. The apparatus according to claim 26 wherein the first delay element comprises a plurality of levels of post-charge inverter logic, and wherein the second delay element comprises a plurality of levels of post-charge inverter logic.

28. In a memory system including a random access memory having a first output node which produces an active signal representing a selected data logic level and a second output node which produces an active signal representing a complementary data logic level, an apparatus for retrieving data from the memory comprising:

master clock means for generating master clock pulses having a selected frequency, each clock pulse having a leading edge and a trailing edge;

data clock means for generating a first data clock pulse corresponding to the leading edge of each master clock pulse, and for generating a second data clock pulse corresponding to the trailing edge of each master clock pulse;

wherein the memory is coupled to the data clock means for receiving the data clock pulses therefrom;

wherein the memory produces first data signals on the first and second output nodes in response to the first data clock pulse and second data signals on the first and second output nodes in response to the second data clock pulse;

wherein the memory has a selected delay between the time a data clock pulse initiates access of the memory and the time the data appears at the first and second output nodes;

a first memory element for storing data signals from the first and second output nodes;

a second memory element for storing data signals from the first and second output nodes; and signal storing means, coupled to the memory, to the first memory element, and to the second memory element, for storing the first data signals in one of the first memory element or second memory element in response to the first data clock pulse and for storing the second data signals in the other first memory element or second memory element in response to the second data clock pulse.

29. The apparatus according to claim 28 wherein the signal storing means comprises:

a first delay element coupled to the data clock for producing a first delayed data clock signal in response to the first data clock pulse, the first delay element having a delay less than the selected delay;

a second delay element coupled to the data clock for producing a second delayed data clock signal in response to the second data clock pulse, the second delay element having a delay less than the selected delay;

wherein the first data signals are stored in one of the first memory element or second memory element in response to the first delayed data clock signal, and the second data signals are stored in the other first memory element or second memory element in response to the second delayed data clock signal.

30. The apparatus according to claim 29 wherein the signal storing means further comprises:

a bistable element coupled to the first delay element and to the second delay element for generating a first bistable signal in response to the first delayed data clock signal and for producing a second bistable signal in response to the second delayed data clock signal; and gate means, coupled to the bistable element, to the memory, to the first memory element, and to the second memory element, for storing the first data signals in the first memory element in response to the first bistable signal and for storing the second data signals in the second memory element in response to the second bistable signal.

31. The apparatus according to claim 30 wherein the bistable element comprises a bistable flip-flop having a first input terminal coupled to the first delay element and a second input terminal coupled to the second delay element.

32. The apparatus according to claim 31 wherein the first memory element comprises a first flip-flop, and wherein the second memory element comprises a second flip-flop.

33. The apparatus according to claim 32 wherein the gate means comprises:

a first AND gate having a first input terminal coupled to the first output node, a second input terminal coupled to the bistable element for receiving the first bistable signal therefrom, and an output terminal coupled to a first input terminal of the first flip-flop;

a second AND gate having a first input terminal coupled to the second output node, a second input terminal coupled to the bistable element for receiving the first bistable signal therefrom, and an output terminal coupled to a second input terminal of the first flip-flop;

a third AND gate having a first input terminal coupled to the first output node, a second input terminal coupled to the bistable element for receiving the second bistable signal therefrom, and an output terminal coupled to a first input terminal of the second flip-flop; and a fourth AND gate having a first input terminal coupled to the second output node, a second input terminal coupled to the bistable element for receiving the second bistable signal therefrom, and an output terminal coupled to a second input terminal of the second flip-flop.

34. The apparatus according to claim 33 wherein the memory propagates the clock signal through a plurality of levels of post-charge inverter logic to generate the selected delay.

35. The apparatus according to claim 34 wherein the first delay element comprises a plurality of levels of post-charge inverter logic, and wherein the second delay element comprises a plurality of levels of post-charge inverter logic.

36. A method for obtaining data from a data circuit having a selected delay between the time a clock signal initiates functioning of the circuit and the time the data appears at an output node of the circuit comprising the steps of:

receiving, by the data circuit, first and second clock signals from a clock signal source;

generating corresponding first and second data signals at the output node in response to the first and second clock signals and at a time consistent with the selected delay;

propagating the first clock signal through a first delay element for producing a first delayed clock signal for gating the first data signal to a first or second memory element, the first delay element having a delay less than the selected delay;

propagating the second clock signal through a second delay element for producing a second delayed clock signal for gating the second data signal to a first or second memory element, the second delay element having a delay less than the selected delay;

storing the first data signal in one of the first memory element or second memory element in response to the first delayed clock signal; and storing the second data signal in the other first memory element or second memory element in response to the second delayed clock signal.

37. The method according to claim 36 further comprising the steps of:

producing a first bistable signal in response to the first delayed clock signal for gating the first data signal to the first memory element;

producing a second bistable signal in response to the second delayed clock signal for gating the second data signal to the second memory element;

storing the first data signal in the first memory element in response to the first bistable signal; and storing the second data signal in the second memory element in response to the second bistable signal.

38. The method according to claim 37 further comprising the step of propagating the clock signal through a plurality of levels of post-charge inverter logic in the data circuit to generate the selected delay.

39. The method according to claim 38 wherein the step of propagating the first clock pulse through the first delay element comprises the step of propagating the first clock pulse through a plurality of levels of post-charge inverter logic, and wherein the step of propagating the second clock pulse through the second delay element comprises the step of propagating the second clock pulse through a plurality of levels of post-charge inverter logic.

* * * * *